(12) United States Patent
Kawamura

(10) Patent No.: US 7,630,053 B2
(45) Date of Patent: Dec. 8, 2009

(54) METHOD OF MANUFACTURING SEMICONDUCTOR DEVICE AND LIQUID IMMERSION LITHOGRAPHY SYSTEM

(75) Inventor: Daisuke Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/727,498

(22) Filed: Mar. 27, 2007

(65) Prior Publication Data
US 2007/0229789 A1     Oct. 4, 2007

(30) Foreign Application Priority Data
Mar. 27, 2006   (JP)   ............... 2006-085664

(51) Int. Cl.
  *G03B 27/52*   (2006.01)
  *G03B 27/42*   (2006.01)
(52) U.S. Cl. .......................... 355/30; 355/53
(58) Field of Classification Search .................... 355/30, 355/53, 67–71, 27; 250/548
See application file for complete search history.

(56) References Cited

U.S. PATENT DOCUMENTS

| | | | |
|---|---|---|---|
| 6,038,015 A * | 3/2000 | Kawata | 355/67 |
| 6,392,738 B1 * | 5/2002 | van de Pasch et al. | 355/30 |
| 6,827,816 B1 * | 12/2004 | Uziel et al. | 156/345.39 |
| 2005/0206868 A1 | 9/2005 | Kruijswijk et al. | |
| 2005/0259235 A1 * | 11/2005 | Kurosawa | 355/55 |
| 2006/0132731 A1 * | 6/2006 | Jansen et al. | 355/30 |
| 2006/0177777 A1 | 8/2006 | Kawamura et al. | |
| 2006/0194155 A1 | 8/2006 | Kawamura et al. | |
| 2007/0127001 A1 * | 6/2007 | Van Der Hoeven | 355/53 |
| 2007/0285639 A1 * | 12/2007 | Liang et al. | 355/53 |
| 2008/0011321 A1 * | 1/2008 | Ikemoto et al. | 134/1.3 |

OTHER PUBLICATIONS

Kawamura et al., "Semiconductor Device Manufacturing Method to Form Resist Pattern, and Substrate Processing Apparatus", U.S. Appl. No. 11/600,198, filed Nov. 16, 2006.
Lin et al., "193-nm Immersion Lithography for 65-nm and Below", (Oral Presentation), $2^{nd}$ International Symposium on Immersion Lithography, pp. 1-27, (2005).
Chang et al., "Advanced Lithography Material Needs for Immersion and Beyond", The $26^{th}$ Tokyo Ohka Seminar, pp. 1-14, (2005).
Kawamura et al., "Influence of the Watermark in Immersion Lithography Process", Proceedings of SPIE, vol. 5753, pp. 818-826, (2005).
Kawamura et al., "Pattern Defect Study Using Cover Material Film in Immersion Lithography", Proceedings of SPIE, vol. 6153, pp. 61513Q1-61513Q9, (2006).

* cited by examiner

*Primary Examiner*—Hung Henry Nguyen
(74) *Attorney, Agent, or Firm*—Finnegan, Henderson, Farabow, Garrett & Dunner, L.L.P.

(57) ABSTRACT

A method of manufacturing a semiconductor device is disclosed. The manufacturing method includes the following steps in a period from a liquid immersion lithography step to a step in which a film structure of at least an edge of a wafer changes from a timing of the liquid immersion lithography step. At least one of a side surface of an edge of the wafer and an upper surface of the edge of the wafer is inspected. On the basis of an inspection result, at least one of the presence/absence of film peeling and the presence/absence of particle adhesion is determined on at least one of the side surface of the edge of the wafer and the upper surface of the edge of the wafer. A predetermined coping process is performed when it is determined that at least one of the film peeling and the particle adhesion has occurred.

14 Claims, 13 Drawing Sheets

Schematic diagram of shower head type liquid immersion lithography apparatus

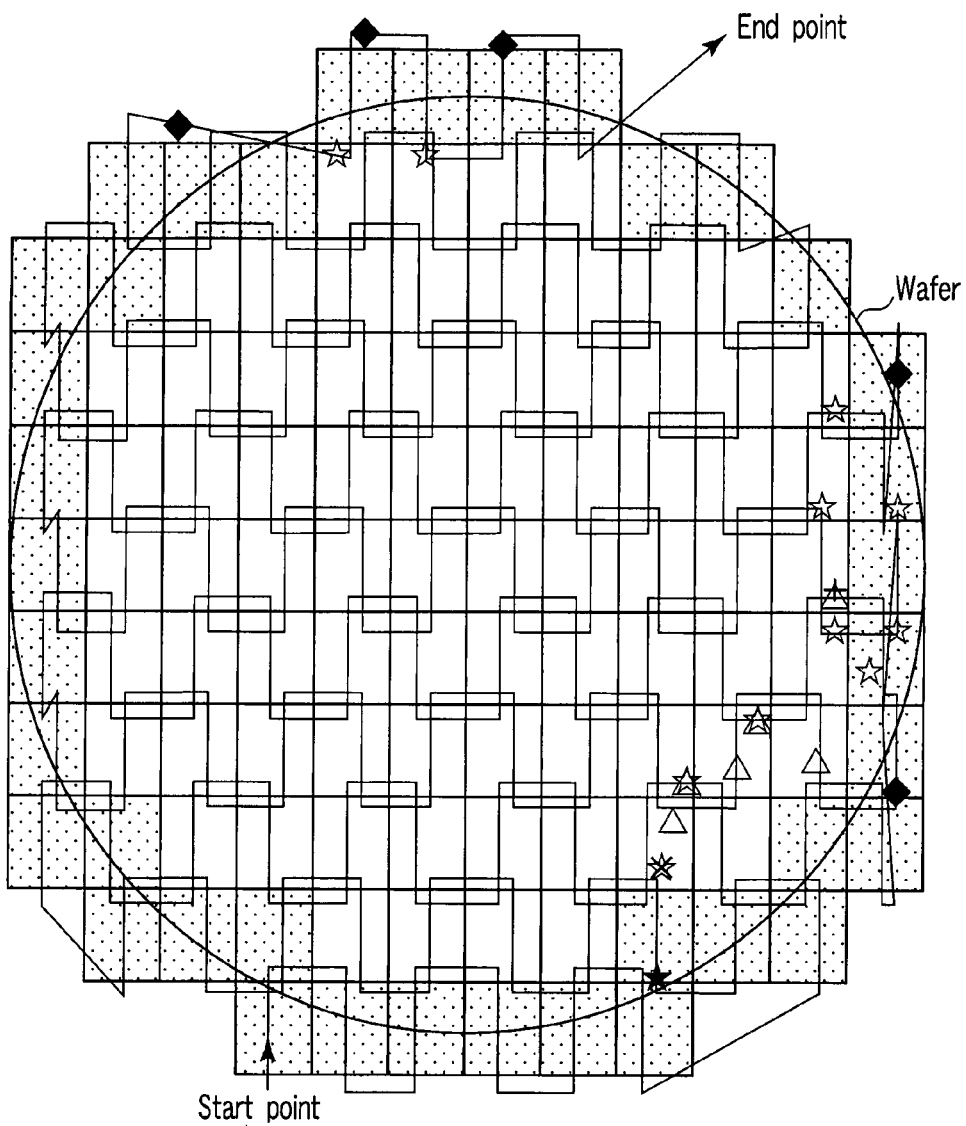

★ : Film peeling position (particle generating source)

✕ : Position of defect to which particle is transferred

☆ : Position where particle remains on wafer

△ : Position of defect transferred by taking the particle in liquid immersion fluid again ◆ : Position where particle remains on wafer stage + : Position of defect transferred by taking particle remaining on wafer stage in wafer again Relational diagram of exposure order of shot array in wafer, cover material film peeling portion, and particle remaining portion

F I G. 3

Block diagram of liquid immersion lithography system when cover material film is not used Example of film structure of wafer edge
(no cover material film and resist edge cut is present)

Another example of film structure of wafer edge
(no cover material film and no resist edge cut)

Block diagram of liquid immersion lithography system when cover material film is not used Another example of film structure of wafer edge
(cover material film is present)

Flow chart when inspection is
performed before pattern exposure

Comparative example

Fourth embodiment

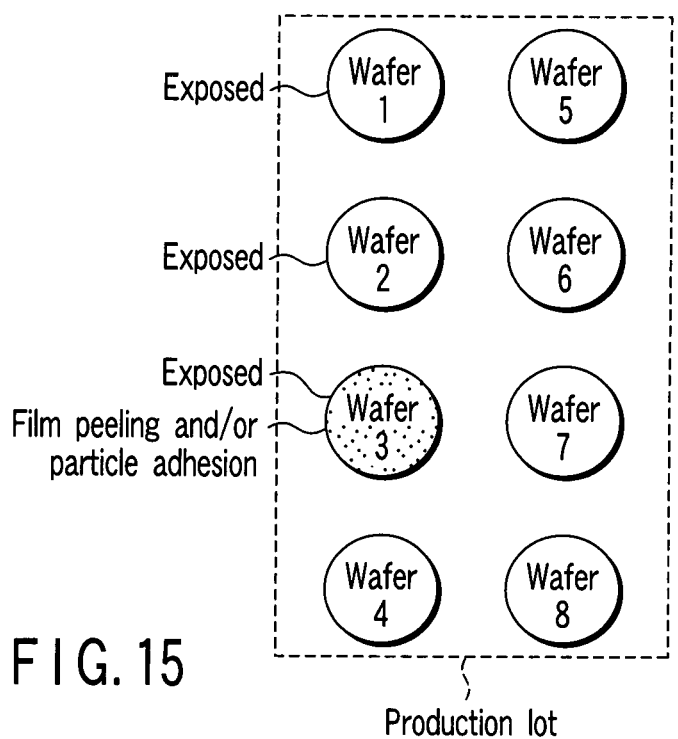
F I G. 15
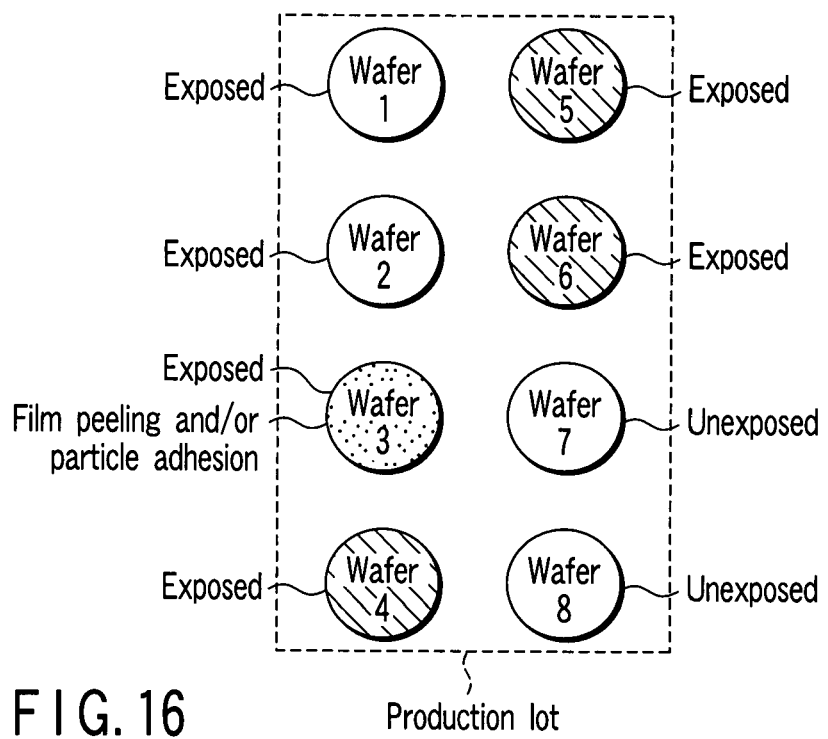
F I G. 16

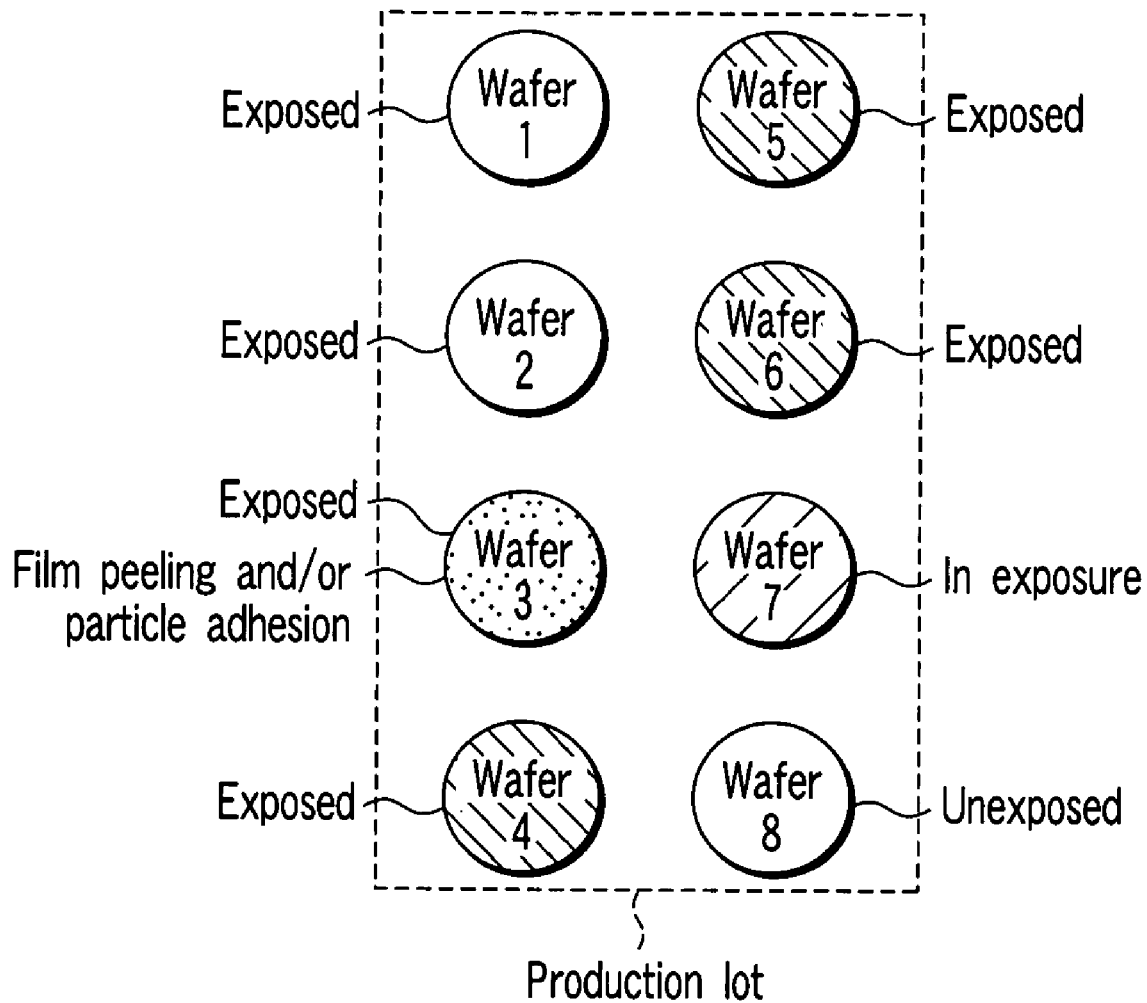
F I G. 17

METHOD OF MANUFACTURING SEMICONDUCTOR DEVICE AND LIQUID IMMERSION LITHOGRAPHY SYSTEM

CROSS-REFERENCE TO RELATED APPLICATIONS

This application is based upon and claims the benefit of priority from prior Japanese Patent Application No. 2006-085664, filed Mar. 27, 2006, the entire contents of which are incorporated herein by reference.

BACKGROUND OF THE INVENTION

1. Field of the Invention

The present invention relates to a method of manufacturing a semiconductor device and, in particular, to a method of manufacturing a semiconductor device using liquid immersion lithography and a liquid immersion lithography system.

2. Description of the Related Art

As a next-generation lithography technique for 193 nm lithography, the development of 193 nm liquid immersion lithography has been advanced. A schematic diagram of a liquid immersion lithography apparatus is shown in FIG. 1.

As shown in FIG. 1, in liquid immersion lithography, a part between a last element of an objective lens of the lithography apparatus and a semiconductor substrate (wafer) on which a resist film serving as a focusing target is formed is filled with liquid (liquid immersion fluid) having a refraction index higher than that of the air. In 193 nm liquid immersion lithography, as a liquid immersion fluid, pure water having a refraction index of about 1.44 is examined. A structure (to be referred to as a shower head hereinafter) to hold the liquid immersion fluid on the wafer is fixed around a projective lens. A wafer stage for holding a wafer is driven to expose a desired position on the wafer. In operations such as exposure of a unit exposure region (to be referred to as a shot hereinafter) presented on a peripheral part of the wafer, insertion or withdrawal of a wafer, and mark detection on a wafer for an overlay mark, the liquid immersion fluid held by the shower head passes through an edge of the wafer. In an exposing operation for the shot of the peripheral part of the wafer, in order to hold the liquid immersion fluid, a table cover plate the level of which is almost adjusted to an upper surface of the wafer is arranged on the upper part of the wafer stage to wind the wafer.

An example of a relative moving path of the shower head to the wafer is shown in FIG. 2.

When the adhesiveness between the film formed on the wafer and the wafer is insufficient, the film may be peeled when the liquid immersion fluid passes through the edge of the wafer. This situation is described in Document 1. It is understood that the relative movement between the liquid immersion fluid and the wafer should cause peeling of the film at the edge of the wafer on an upper surface side of the wafer which may be in contact with the liquid immersion fluid and on a side surface of the wafer where a flow of liquid immersion fluid is supposed to be disturbed.

As described in Document 1, particles are made from the peeled film, held in the liquid immersion fluid to be present on the optical path, and may be transferred on a pattern on the wafer. Even though the peeled films are not curled like particles and kept in the shapes of flakes, the peeled films may serve as origin of a pattern defect in any case because refraction indexes of the films and the liquid immersion fluid are different from each other and because the films cannot be kept perpendicular to a plurality of refracted lights.

When moving of a wafer stage in the liquid immersion lithography apparatus is considered, particles generated at an edge of a certain wafer are conveyed to a position on the wafer different from a particle generating portion on the wafer and remains in accordance with relative movement between the liquid immersion fluid and the wafer. On the other hand, in a shot exposing operation which is later in the shot exposure order, when the liquid immersion fluid passes through a particle remaining position, the particles remaining in the liquid immersion fluid are taken in again, and a defect may be transferred to still another position.

The particles taken in the liquid immersion fluid may remain on the table cover plate of the wafer stage and on a side surface of the table cover plate which is a gap between the side surface of the table cover plate and the side surface of the wafer. In this case, as in the case where the particles remain on the wafer, the particles are taken in the liquid immersion fluid by the relative passing of the liquid immersion fluid which occurs again, and the defect is transferred to a different position on the wafer again. Alternatively, the particles remain on the wafer. The wafer influenced by the particles remaining on the table cover plate of the wafer stage may be on the same wafer as that on which film peeling occurs depending on the remaining positions of the particles and a flow of the liquid immersion fluid in the shower head, or may be on the subsequent wafer.

FIG. 3 shows a film peeling position (black star sign) which is a particle generating source, a defect position (X sign) to which a particle is transferred, a position (white start sign) where a particle remains on a wafer, a defect (white triangular sign) transferred when the particle is taken in the liquid immersion fluid again, a position (black lozenged sign) where a particle remains on the wafer stage, and a position (plus sign) of a defect transferred when the particle remaining on the wafer stage is taken in the wafer again.

Document 2 describes some particle formation mechanism and tool cleaning concern. However, Document 2 does not describe timing at which tool cleaning is performed and a trigger for the cleaning at all.

In Document 3, research members including the present inventor have reported that liquid immersion fluid remaining on a wafer forms a watermark as a pattern defect.

Document 1: Lin john C. H., "193-nm immersion lithography for 65-nm node and below" (oral presentation), p. 24, 2nd International Symposium on Immersion Lithography, 12-15 Sep. 2005

Document 2: Ching-Yu Chang et al., "Advanced Lithography Material Needs for Immersion and Beyond" THE 26th TOKYO OHKA SEMINAR, Dec. 6, 2005

Document 3: D. Kawamura, et al., "Influence of the Watermark in Immersion Lithography Process", Proc. SPIE vol. 5753, pp. 818-826 (2005).

BRIEF DESCRIPTION OF THE SEVERAL VIEWS OF THE DRAWING

FIG. 3 is a diagram showing a relationship among the exposing order of shot array in the wafer, a cover material film peeling portion, and a particle remaining portion;

FIG. 15 is a diagram showing a first example of a wafer to be send to pattern defect inspection or a rework process;

FIG. 16 is a diagram showing a second example of the wafer to be send to the pattern defect inspection or the rework process; and FIG. 17 is a diagram showing a third example of the wafer to be send to the pattern defect inspection or the rework process.

DETAILED DESCRIPTION OF THE INVENTION

As described in the section of Background Art, when film peeling occurs, in any case, a yield decreases. Furthermore, when film peeling occurs, the possibility of accumulating influence of the film peeling may be high.

In particular, in liquid immersion lithography, when a nozzle (i.e. shower head) which holds liquid immersion fluid passes through an edge of a wafer in a liquid immersion lithography apparatus, a risk that a film on the wafer is peeled because of a difference in velocity between the liquid immersion fluid and the wafer is high. The peeled film remains inside the liquid immersion lithography apparatus, in particular, on a region on a wafer stage through which the liquid immersion fluid passes. The peeled film is taken in the liquid immersion fluid again in exposure to the wafer to serve as origin of a transfer defect. In the liquid immersion lithography, the transfer defect may occur not only in the wafer but also in a subsequent wafer.

Therefore, in order to improve the yield in the liquid immersion lithography step, it is necessary to detect occurrence of the defect and perform processing such as cleaning of a wafer stage.

In the embodiment described below, states of an edge of a wafer before and after pattern exposure performed by a liquid immersion lithography apparatus are inspected. When at least one of film peeling on the wafer and particle adhesion with liquid immersion lithography apparatus is recognized, a predetermined coping process is executed. As concrete examples of the coping process, several examples are known. As typical examples, cleaning of a wafer stage of the liquid immersion lithography apparatus, stop of processing for the wafer, and execution of additional inspection to the wafer, and the like are known.

Prior to description of the embodiment, a reference of the embodiment of the invention will be described below. This reference is an example of a liquid immersion lithography step to which the embodiment of the present invention can be applied, and partially constitutes the embodiment of the invention.

(Reference 1)

Reference 1 is an example of a general liquid immersion lithography step.

Figure 4:
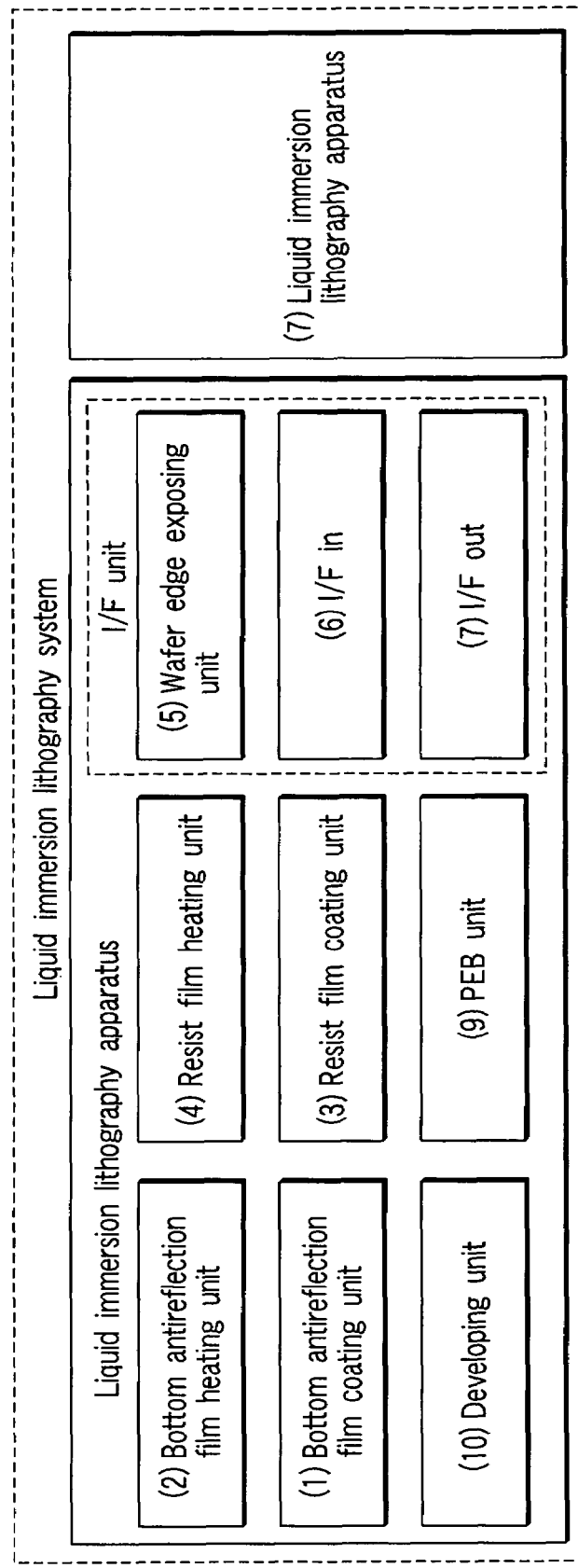
FIG. 4 is a block diagram showing an example of a liquid immersion lithography apparatus (when a cover material film is not used)

In general, the liquid immersion lithography system includes a coating and developing apparatus and a liquid immersion lithography apparatus. In general, an interface unit (to be referred to as an I/F unit) which connects the coating and developing apparatus to the liquid immersion lithography apparatus is present on the coating and developing apparatus. A block diagram of the system is shown in FIG. 4.

Encircled numbers in FIG. 4 indicate a step order in a liquid immersion lithography step (will be described later). A temperature control step (Chill Plate) before coating, a cooling step (Cooling Plate) after a heating step, an adhesion improving step, and the like are omitted. Similarly, pre-exposure rinse, post-exposure rinse, and the like are also omitted. As will be described later, when an bottom antireflective film can be found without the coating and developing apparatus, such as SiN (silicon nitride), an antireflective film coating unit and an antireflective film heating unit are not necessary.

The details will be described below along the step order.

A bottom antireflective film and a resist film are formed on a wafer.

As the bottom antireflective film, films of the following types can be used. A double layer antireflective film constituted by an opaque film and an interference film may also be used. As the opaque film of the double layer antireflective film, an organic film, a sputtered carbon film, an amorphous Si film, a poly-Si film, or the like can be used. As the interference film, a SiO film, a SiN film, a SiON film, an SOG film, organic BARC, or the like can be used. A SiONH-based hard mask, in which non-stoichiometric composition changed continuously or discontinuously in a direction of film thickness, may also be used.

A typical method of forming a resist film or a coating-type antireflective film includes formation of liquid immersion film by spin coating and a heating step. In the spin coating step, back rinse and edge rinse are performed as needed. In formation of the bottom antireflective film, the resist film, and the like, as needed, an adhesion improving process such as an HMDS (hexamethyldisilane) process may be performed.

Figure 5:
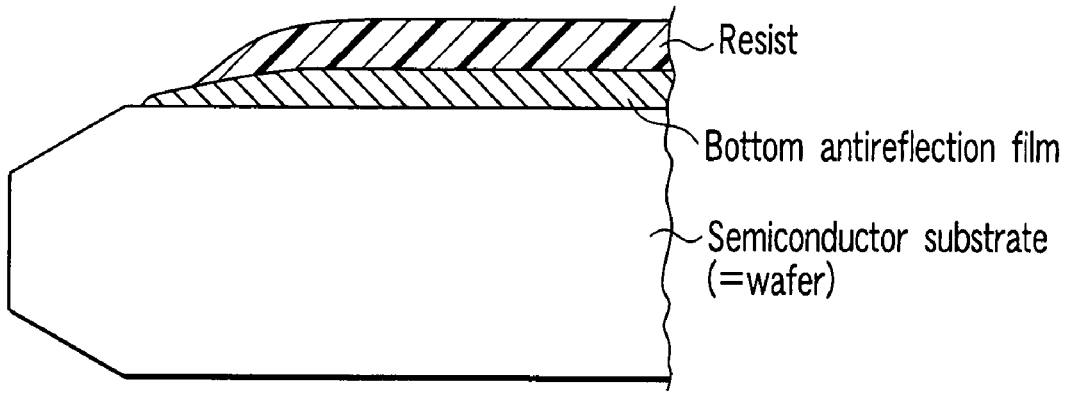
FIG. 5 is a sectional view showing an example of a film structure of a wafer edge (no cover material film, and a resist edge cut is present)
Figure 6:
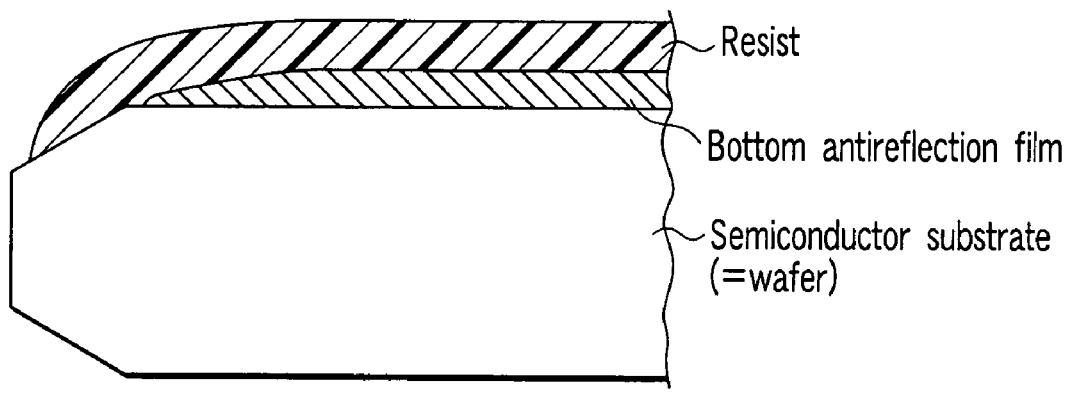
FIG. 6 is a sectional view showing an example of the film structure of the wafer edge (no cover material film, and no resist edge cut)

FIG. 5 shows, as an example of a laminate structure at an edge of the wafer, an example in which the resist film is subjected to removal (edge cut) of the edge of the wafer by predetermined quantity by edge rinse (and back rinse). FIG. 6 shows, as another example of the laminate structure at the edge of the wafer, an example in which the resist film is formed up to an upper part of the edge of the wafer without being edge-cut.

In conventional pattern exposure performed when the air is filled between an objective lens and a wafer (to be referred to as Dry exposure hereinafter), edge cut is generally performed by an appropriate amount due to the limitations in a processing step using a resist pattern as a process mask in the following process step. On the other hand, in liquid immersion lithography, in the case where materials on the wafer surface are different from each other and the wafer surface is stepped when the liquid immersion fluid passes through an edge of the wafer, the liquid immersion fluid may remain at the corresponding portion, or the remaining liquid immersion fluid may be scattered around the portion. It was found from an examination performed by the research members including the present inventor that the liquid immersion fluid remaining on the wafer forms a watermark and serves as a pattern defect (Document 3: D. Kawamura, et al., "Influence of the Watermark in Immersion Lithography Process", Proc. SPIE vol. 5753, pp. 818-826 (2005)). For this reason, in the liquid immersion lithography, as shown in FIG. 6, it is also understood to be effective that the entire surface of the wafer is covered with a resist film.

The wafer on which the resist film is formed may be subjected to a wafer edge exposure step as needed. The wafer edge exposure step is performed to smooth a boundary between the edge of the wafer and the resist film after developing in the lithography step. The wafer edge exposure step may be executed after the pattern exposure step.

Figure 1:
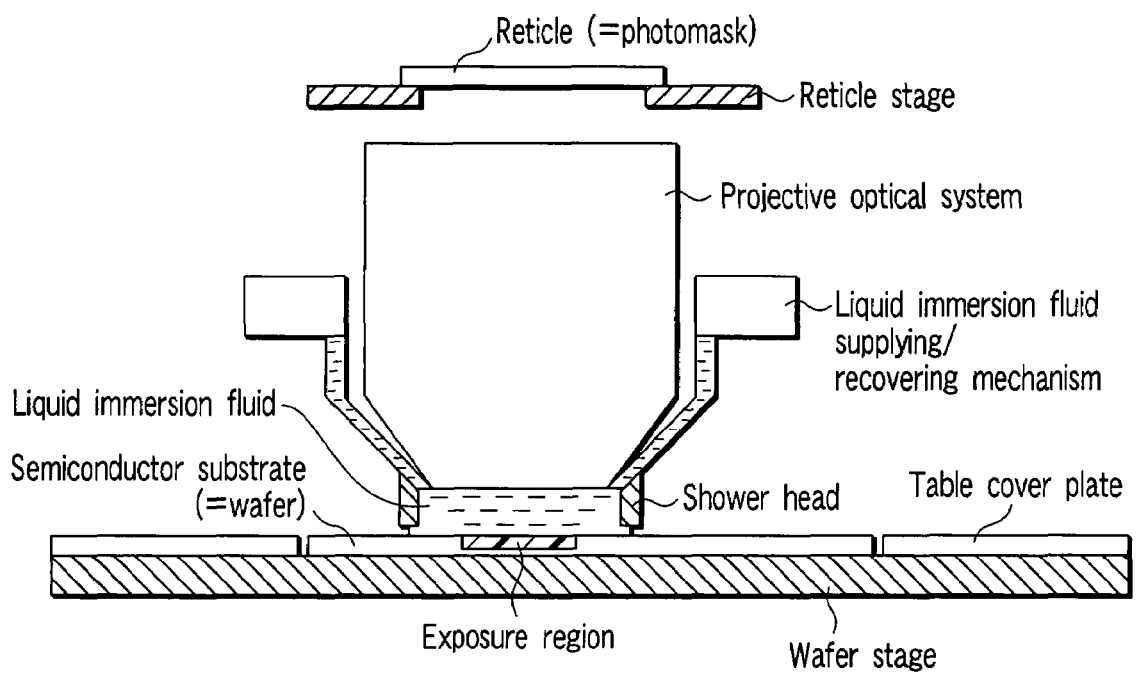
FIG. 1 is a schematic diagram showing a liquid immersion lithography apparatus.
Figure 2:
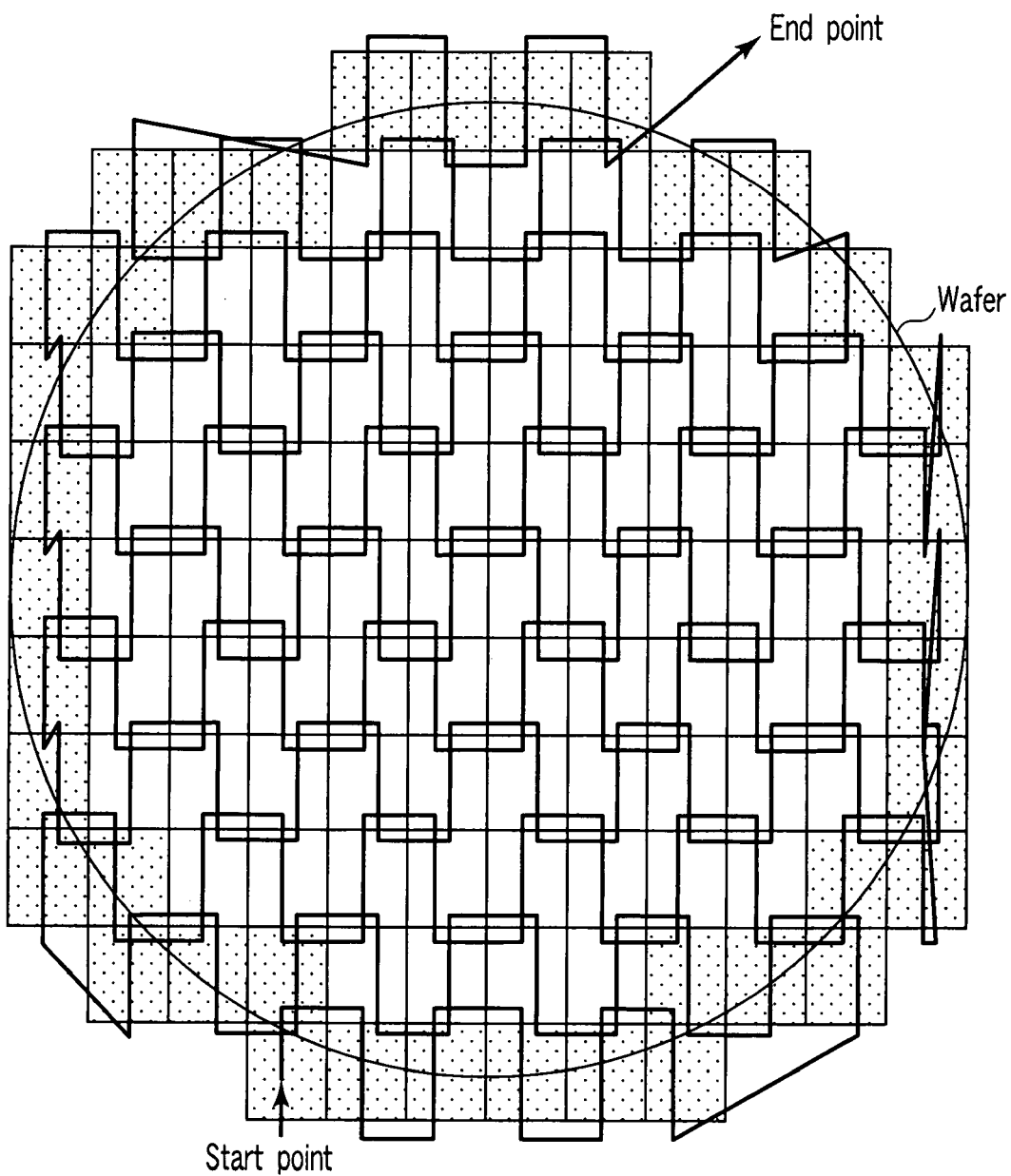
FIG. 2 is a diagram showing an exposing order of shot array in a wafer.

The wafer formed resist film is subjected to the pattern exposure step of irradiating exposure light patterned to form a desired pattern by using the liquid immersion lithography apparatus shown in FIG. 1. Typically, the pattern is transferred through a photomask on which the desired pattern is formed.

The resist film on which the patterned exposure light is irradiated is subjected to a post exposure bake step (to be referred to as a PEB step hereinafter). In a 193 nm (liquid immersion) lithography, a chemical amplified positive-tone resist is typically used. However, a negative-tone resist is used in some cases. Chemical amplified positive-tone resist contain photo acid generator which generate acid by the irradiation of exposure light. In the PEB step, a photo acid reacts with a dissolution inhibition group in a resist resin to give solubility to a developing step (will be performed later). As a result, the resist exhibits the characteristics of a positive-tone to the patterned exposed light in which the exposed position is dissolved and removed by a developer.

A developing step, which is generally performed by a TMAH developer, is performed to the resist film processed in the PEB step to obtain a resist pattern.

In the liquid immersion lithography step, as described in the section of Background Art, by relative passing of liquid immersion fluid, a film on the wafer, typically, a film at the edge of the wafer may be peeled. The peeled film forms particles. The particles are held in the liquid immersion fluid to be present on an optical path, and may be transferred on a pattern on the wafer. Even though the peeled films are not curved like particles and kept in the shapes of flakes, the peeled films may serve as transfer origins of a pattern defect in any case because refraction indexes of the films and the liquid immersion fluid are different from each other and because the films cannot be kept perpendicular to a plurality of refracted lights.

When considering movement of the wafer stage in the liquid immersion lithography apparatus, particles generated at an edge of a wafer are transported to positions different from the particle generating positions on the wafer and remain therein by relative movement between the liquid immersion fluid and the wafer. On the other hand, in pattern exposing operation of the later other shot in the shot exposure order, when the liquid immersion fluid passes through a particle remaining position, the particles remaining in the liquid immersion fluid are taken in again, and a defect may be transferred to still another position.

The particles taken in the liquid immersion fluid may remain on an table cover plate of the wafer stage or a cavity (to be generally referred to as on an table cover plate hereinafter) between a side surface of the wafer and the table cover plate. In the case of the particles remained on the wafer, the particles are taken in the liquid immersion fluid by the relative passing of the liquid immersion fluid which occurs again, and the defect is transferred to a different position on the wafer again. Alternatively, the particles remain on the wafer. The wafer influenced by the particles remaining on the table cover plate of the wafer stage may be on the same wafer as that on which film peeling occurs depending on the remaining positions of the particles and a flow of the liquid immersion fluid in the shower head, or may be on the subsequent wafer. With respect to the relationship between a cover material film peeling portion and a particle remaining portion, see FIG. 3 described in the section of Background Art.

In any case, when film peeling occurs, some proceeding to recover the yield loss must be executed. As described at the beginning of the embodiment and can be analogized from the above contents, when film peeling occurs, the possibility of accumulating influence of the film peeling in the liquid immersion fluid, on the surface of the table cover plate of the wafer stage in the liquid immersion lithography apparatus, or the like may be high.

Therefore, in order to increase the yield in the liquid immersion lithography step, the above fact must be detected to perform proceeding such as cleaning of a wafer stage.

(Reference 2)

Reference 2 is obtained by modifying a general liquid immersion lithography step. In particular, Reference 2 is an example in which a resist is covered with a cover material film.

Figure 7:
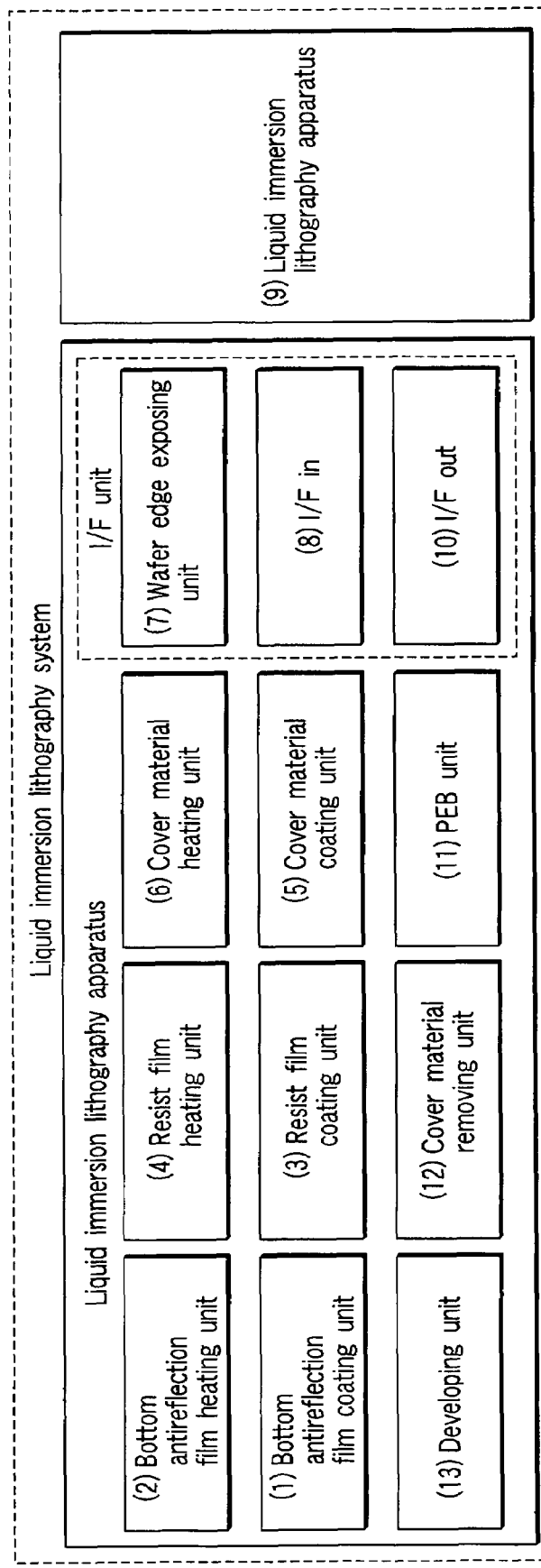
FIG. 7 is a block diagram showing an example of a liquid immersion lithography apparatus (when a cover material film is used)

A block diagram of a liquid immersion lithography system obtained in this case is shown in FIG. 7. When a developer-soluble type cover material film (will be described later) is used, a cover material film removing unit is not necessary. Encircled numbers in FIG. 7 indicate a step order in a liquid immersion lithography process (will be described later). A temperature control step (Chill Plate) before coating, a cooling step (Cooling Plate) after a heating step, an adhesion improving step, and the like are omitted. Similarly, pre-exposure rinse, post-exposure rinse, and the like are also omitted. As will be described later, when an bottom antireflective film can be made of a material such as SiN by means except for a coating and developing apparatus, an antireflective film coating unit and an antireflective film heating unit are not necessary.

The following description includes only a supplement to the case which does not use a cover material film described in Reference 3.

The cover material film includes two types: a solvent-removal type (for example, TSP-3A and TSRC-002 available from TOKYO OHKA KOGYO CO., LTD.) in which a cover material film stripping step is generally performed by using a dedicated solvent between the PEB step and the developing step; and a developer-soluble type (for example, TILC series available from TOKYO OHKA KOGYO CO., LTD., TCX series available from JSR Corporation, IOC series available from Shin-Etsu Chemical Co., Ltd., and the like) in which a cover material film is continuously stripped by a TMAH developer prior to development of a resist.

Typically, a cover material film is formed by spin coating and heating on a resist film formed by spin coating and a heating step.

The cover material film is mainly used for two purposes. As one of the purposes, hydrophobicity of a wafer surface is improved in relative movement between liquid immersion fluid and the wafer to prevent the liquid immersion fluid from remaining on the wafer. This prevents a defect caused by the watermark described in Reference 3. The other is leaching issue of the a component of resist, such as a photo acid generator, a photo acid, a base serving as a quencher for an acid in the resist film or an underlying film thereof is prevented from being eluted in the liquid immersion fluid to prevent a last element of a projective lens from being contaminated or to moderate contamination of the last element.

Figure 8:
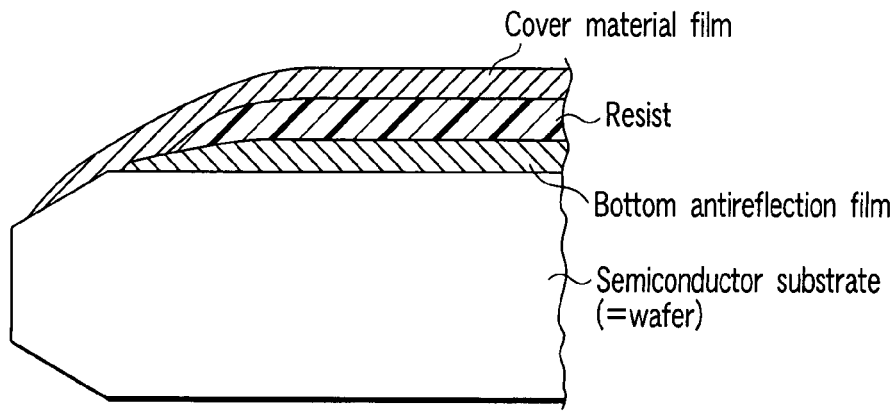
FIG. 8 is a sectional view showing an example of the film structure of the wafer edge (a cover material film is present)

Therefore, a state desired as a coating film at a resist edge of the resist, the cover material film, or the like is a state in which the cover material film covers the resist film as shown in FIG. 8.

After the formation of the cover material film, a wafer edge exposure step for the resist is performed as needed, and pattern formation is performed by the liquid immersion lithography apparatus.

In a solvent-soluble type cover material film, after the execution of the PEB step, by using a dedicated solvent (TSP-3 Remover available from TOKYO OHKA KOGYO CO., LTD. when the TSP-3A available from TOKYO OHKA KOGYO CO., LTD. is used), the cover material film is removed. A developing step is performed to the resist film from which the cover material film is removed to obtain a resist pattern by using a TMAH developer in general.

In the developer-soluble type cover material film, after the PEB step, by the TMAH developer, the cover material film is continuously removed prior to developing of the resist pattern to obtain a resist pattern.

Even though the cover material film described in this reference is used, as in the case described in Reference 1 in which the cover material film is not used, a pattern defect caused by peeled film is transferred to the resist pattern.

Since the cover material film has low adhesion to a surface structure of a wafer such as an Si (silicon) wafer or an $SiO_X$ (silicon oxide) film to which a natural oxide is attached, concerns about peeling caused by relative movement of the liquid immersion fluid in the liquid immersion lithography apparatus increase.

Embodiments of the present invention will be described below in detail with reference to the accompanying drawings. In this description, the same reference numerals denote the same parts in all the embodiments.

FIRST EMBODIMENT

An outline of a lithography system including an inspection step for adhesion of particles generated by film peeling on an edge face of a wafer by relative movement of liquid immersion fluid or film peeling caused by a wafer exposed in advance in the liquid immersion lithography apparatus described in Reference 1 and 2, and a coping process performed when the film peeling occurs will be described below.

Figure 9:
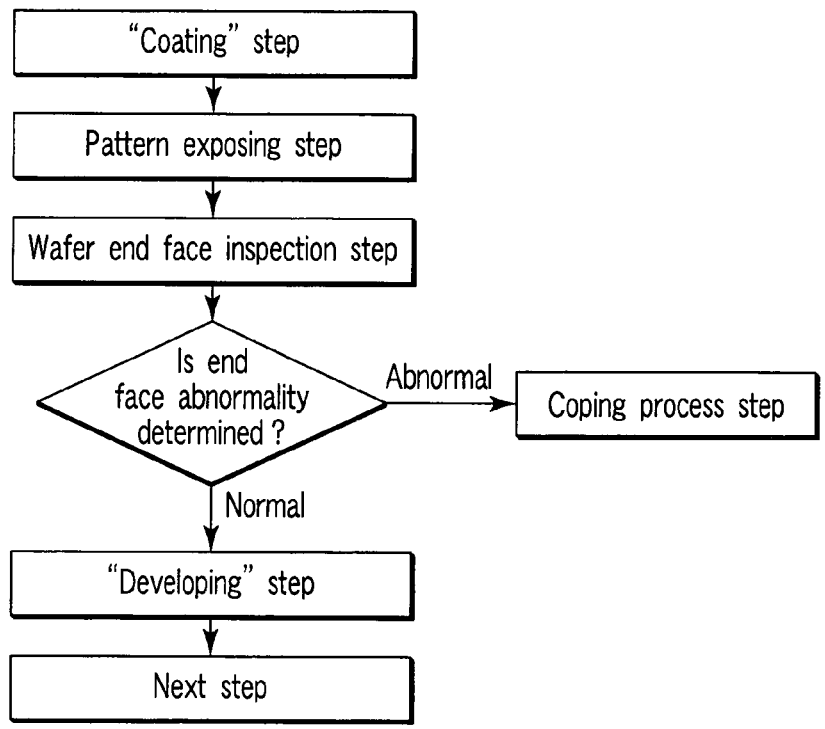
FIG. 9 is a flow chart showing an example when inspection is performed before pattern exposure according to a first embodiment of the present invention.

A flow chart of the embodiment is shown in FIG. 9. A "coating" step in the flow chart includes all the processes performed until a wafer is given to the liquid immersion lithography apparatus in the coating and developing apparatus. A "developing" step includes all processes in the coating and developing apparatus after the pattern exposure step performed by the liquid immersion lithography apparatus.

After the pattern exposure process performed by the liquid immersion lithography apparatus, predetermined inspection is performed to detect film peeling, and adhesive material, or the like at the edge of the wafer.

In the liquid immersion lithography apparatus, particles in an optical path of the liquid immersion fluid are transferred, or liquid immersion fluid remains on the wafer to cause water immersion and to serve as a pattern defect origin. For this reason, particle management is performed, and a countermeasure against generation of dust is taken in a transport system. Therefore, sources of generating an adhesive material which can be detected at the edge of the exposed wafer include particles carried by the wafer, film peeling occurring on the wafer, and particles (including film peeling) generated from the wafer subjected to pattern exposure in advance.

Predetermined inspection must be performed after the pattern exposure and before the step in which the uppermost film may be removed.

When the cover material film is not used (described in Reference 1), the predetermined inspection step is performed after the pattern exposure step and before the developing step. When a solvent-removal type cover material film is used (described in Reference 2), the predetermined inspection step is performed after the pattern exposure step and before the cover material film stripping step. When the cover material film is of a developer-soluble type, the cover material film stripping step can be performed sequentially to the developing step.

When a post-exposure rinse step is performed after the pattern exposure, if the cover material film may be peeled by the post-exposure rinse step, or if it is not known whether the cover material film is peeled, the predetermined inspection step is performed after the pattern exposure and before the post-exposure rinse step.

An outline of a coping process required when film peeling at an edge face of the wafer by an interaction with the liquid immersion fluid or particles caused by peeling are detected by the predetermined inspection step will be described below.

The coping process required when film peeling or particles at the edge face of the wafer are detected includes four roughly classified items. With respect to the coping process roughly classified into the following four items, a plurality of coping processes are desirably taken. Ideally, at least one process is desirably performed to each of the four items.

(1) Cleaning of a wafer stage table cover plate of a liquid immersion lithography apparatus, or a monitor for at least a state. When monitoring of cleaning and state cannot be automatically performed and separately performed by an operator, an instruction to the operator for the process is included.

As a result, a pattern defect can be prevented from being transferred to a subsequent wafer by particles generated by films peeled from the wafer.

When influence of a state of a surface of a wafer stage table cover plate, which is predicted by the number of times of detection, a region, or sizes of film peeling or particles, and positions of the film peeling or the particles on the wafer, on a yield of the element can be reliably predicted, depending on a loss caused by the stop of the apparatus by a cleaning process of the wafer stage table cover plate and a loss caused by a decrease in yield of the element, the cleaning process may be thinned out.

(2) At least one of stop of shifting of the lithography step to the subsequent step, check of a defect occurrence state, and a rework process step of the lithography step in a wafer detected by the inspection or a manufacturing lot to which the wafer belongs. When the process cannot be automatically performed and is performed by an operator, an instruction to the operator for the process is included.

In fact, the rework process step is performed to all the wafers without performing inspection, or the rework process step is performed to only a wafer which is determined as a defective wafer by the inspection.

Rework is performed in at least the next process step before the processing to make it possible to prevent the yield from being reduced.

Furthermore, inspection of a defect occurrence state is performed to the wafer or, in addition to the wafer, a wafer subjected to the lithography step process after at least the wafer in a production Lot including the wafer, thereby making it possible to reduce a rework cost of the wafers the defect distributions of which are acceptable. An example of inspection apparatus of the defect occurrence state is optical pattern defect inspection which is available from KLA-Tencor Corporation, for example or a pattern defect inspection with image processing performed by an electron beam image. In addition, classification of defect types by an optical or SEM-type review apparatus may be included. In general, the cost of the lithography step is higher than that of the inspection step. However, with an increase in price of a lithography apparatus in the liquid immersion lithography step, the number of rework process steps is reduced so as to reduce the cost.

(3) An instruction for cleaning or exchanging units and a conveying system in a liquid immersion lithography apparatus constituted by a liquid immersion lithography apparatus and a coating and developing apparatus to which a wafer detected by the inspection is conveyed and a wafer conveying vessel (broadly-defined wafer cases including FOUP (Front Opening Unified Pod), SMIF (Standard of Mechanical Interface) or the like) in which the wafer is stored, or an instruction for at least state monitor.

When particles are present on a side surface of a wafer, by conveying the wafer, the liquid immersion lithography apparatus being in contact with the side surface of the wafer, in particular, the units of the coating and developing apparatus, or the conveying system, and the wafer conveying vessel are contaminated. When the coating and developing apparatus is contaminated, a wafer subsequent to the corresponding wafer or a Lot to be subsequently processed may be contaminated. When portions being in contact with side surfaces of a wafer before and after the pattern exposure in the liquid immersion lithography apparatus are present in the coating and developing apparatus or the liquid immersion lithography apparatus, particles may be generated on the wafer stage table cover plate of the liquid immersion lithography apparatus. This process is performed to make it possible to prevent a yield of subsequent wafers from decreasing.

On the other hand, when the wafer conveying vessel is similarly contaminated, even if a pattern defect of the wafer itself is acceptable in the lithography step, the possibility that the wafer conveying vessel be a contaminating source in the subsequent processes or a trouble source of the processing apparatus remains. When the wafer conveying vessel is cleaned or exchanged to prevent the contamination or the trouble.

(4) Review of coating conditions (including edge rinse and/or back rinse conditions) of at least the uppermost film on a wafer detected by the inspection. When an adhesion improving process such as an HMDS (Hexamethyl disilazane) process is performed, review of conditions for the process or check of a state of the wafer.

SECOND EMBODIMENT

As a method of inspecting an wafer edge, a detecting mechanism which is the same as the wafer edge face inspection apparatus or a detecting mechanism incorporated in a bevel polishing apparatus can be used. More specifically, the method is constituted by: a detecting mechanism constituted by an optical system including a lens, an optical filter as needed, and an image detecting unit such as a CCD, a storing device, and an image processing device; and a mechanism which moves either one of or both of a wafer edge used to inspect an interested position on the outer periphery of the wafer, and the detecting mechanism.

By relative movement between liquid immersion fluid and a wafer in liquid immersion lithography, on an upper surface side of the wafer which may be in contact with the liquid immersion fluid and on a side surface of the wafer on which a flow of liquid immersion fluid is supposed to be disturbed to some extent, film peeling at an edge of the wafer may occur.

As film forming means in semiconductor manufacturing steps, sputtering, CVD, and spin coating (by which application of chemical is typified) are typically used. In the sputtering and the CVD of these means, the film is also formed on a rear surface of a wafer. In spin coating performed in appropriate edge rinse or back rinse, the edge of the film forms a continuous line connected in a circumferential direction of the wafer.

For this reason, when the edge of the wafer is observed, changes of film types and film thicknesses in a radial direction of the wafer are detected on the upper surface and on the side surface of the wafer. In an inspection image, the changes are detected as changes of colors and signal intensities or a boundary.

As an example of an image processing method to automatically detect film peeling or adhesion of particles, a differential process in a range of the inspection image is conceived. The differential direction may be only the radial direction of the wafer or both of the radial direction and the circumferential direction. It is understood that film peeling, a particle adhesion point can be detected as abnormal points by comparing differential amounts at adjacent positions in the circumferential direction of the wafer. More specifically, comparison between the differential amounts of an interested point and a position adjacent thereto and a threshold value, comparison between the differential amount predicted from a position near the interested point and the differential amount of the interested point, and the like can be used. In addition to this, various edge enhancing algorithms such as deconvolution or/and an algorithm for detection may be used.

On the other hand, when peeling of a coating film occurs, in a normal portion where the film is present and a film peeled portion where no film is present, colors of an observed image or signal intensities are detected as changes and boundaries. A portion to which particles generated by film peeling adhere is similarly detected as a change in signal intensity or a boundary.

THIRD EMBODIMENT

An example obtained by improving the method of inspecting a wafer edge in the second embodiment will be described below.

In the second embodiment, in order to detect film peeling or adhesion of particles at an edge of a wafer, before and after the pattern exposure step performed by the liquid immersion lithography apparatus, the edge of the wafer is inspected, and the film peeling or the adhesion of particles is detected on the basis of both pieces of inspection information.

As described in the second embodiment, when detection is performed only after the liquid immersion pattern exposure step, ununiformity of a film composition which is present at the edge of the wafer before the liquid immersion pattern exposure step without causing film peeling in the liquid immersion pattern exposure step or adhesion of particle may be detected. In order to prevent such false detection, a method of inspecting the edge of the wafer before and after the liquid immersion pattern exposure step is desirably performed.

The ununiformity of the film composition which is present at the edge of the acceptable wafer before the liquid immersion pattern exposure step without causing film peeling in the liquid immersion pattern exposure step or particle adhesion means the following state.

When an bottom antireflective film and a wafer layer thereunder is formed by a film forming step such as CVD or sputtering, an ununiformed structure may be generated as a film structure at the edge of the wafer. However, adhesion of the film itself or a film such as a resist formed on the film in the coating step in the liquid immersion lithography step is sufficiently stronger than force generated by relative movement between the liquid immersion fluid and the wafer.

Ununiformity of a film thickness caused in etching performed before the liquid immersion lithography step or in another processing step can be understood like the uniformity of the film structure in the film forming step.

On the other hand, in the steps before the lithography step or in shift between the steps, scratches may be made at an edge of a wafer by collision or the like of the wafer. In this case, a boundary portion (typically, an edge of a film) of a film such as a resist film formed in a spin coating step in the lithography step may exhibit uniformity in the scratch of the wafer. However, when the spin-coating film has sufficient adhesion to the underlying film or the wafer in comparison with force generated by relative movement between the liquid immersion fluid and the wafer, film peeling does not occur after all.

When removal of a coating film at an unnecessary portion in back rinse or, in addition, edge rinse in the spin coating step is imperfect or ununiform, a boundary of an edge of the coating film is not uniform, and a position in the radial direction of the wafer or a position in the direction of film thickness of a side surface of the wafer moves in the circumferential direction of the wafer. (When a projection drawing viewed from the upper surface of the wafer is assumed, a boundary of the coating film does not draw a smooth circle along a circumferential direction and draws a step-like curve.) Desirably, the back rinse or, in addition, the edge rinse is adjusted to make the boundary of the edge of the coating film uniform. However, the possibility that the boundary of the edge of the coating film is ununiform remains due to a change of apparatus states, changes of an edge structure and film types of the wafer because the wafer is a process wafer, and scratches and structural ununiformity of an underlying film and the wafer. However, in this case, when the spin-coating film has sufficient adhesion to the film thereunder or the wafer in comparison with force generated by relative movement between the liquid immersion fluid and the wafer, film peeling does not occur after all.

Inspection of a wafer edge before the pattern exposure step described in the embodiment need not be performed immediately before the pattern exposure step in the liquid immersion lithography step. The inspection may be performed in a stage in which a film structure obtained immediately before the pattern exposure step does not change, more accurately, in a stage in which a film structure does not change in the wafer edge inspection step. For example, when the inspection is performed in image processing by a CCD or the like as exemplified as inspection after the pattern exposure step described in the second embodiment, a wavelength for the inspection is generally a wavelength of visible light. This is because the wavelength must be a wavelength of light which does not expose a resist used in the lithography step. The wafer edge exposure step is a step in which light to expose the resist film is irradiated on an edge of the resist film. The resist film at the corresponding portion photochemically reacts. However, depending on photochemical reactions in a chemical amplified resist used in the liquid immersion lithography step, a change in optical constant of the resist film in the visible light region is practically nought. Therefore, inspection of the wafer edge before the pattern exposure may be performed before the wafer edge exposure step.

When influence on wafer edge inspection by exposure light in the wafer edge exposure, for example, a change or the like of a base line of a detection signal of an inspection image to be acquired can be prevented, the inspection may be performed simultaneously with the wafer edge exposure step. More specifically, an existing wafer edge exposure step unit is constituted by a mechanism which illuminates exposure light only on a predetermined range limited in the circumferential direction and a mechanism which rotates a wafer. The inspection apparatus may be arranged at a position which is different from an irradiated portion of exposure light and at which the exposure light does not influence a detecting unit of the inspection apparatus at the edge of the wafer.

Also in the case where a pre-exposure rinse step is performed before the pattern exposure, if an edge of the wafer does not change in the pre-exposure rinse step, the inspection step for the edge of the wafer may be performed before the cleaning step and before the pattern exposure.

In the range in which the constrained conditions in the inspection step for the edge of the wafer are satisfied, time for executing the inspection step for the edge of the wafer or the structure of the inspection unit may change.

FOURTH EMBODIMENT

An example of a liquid immersion lithography system to which the first to third embodiments can be applied will be described as a fourth embodiment.

(Basic Configuration of System)

Figure 10:
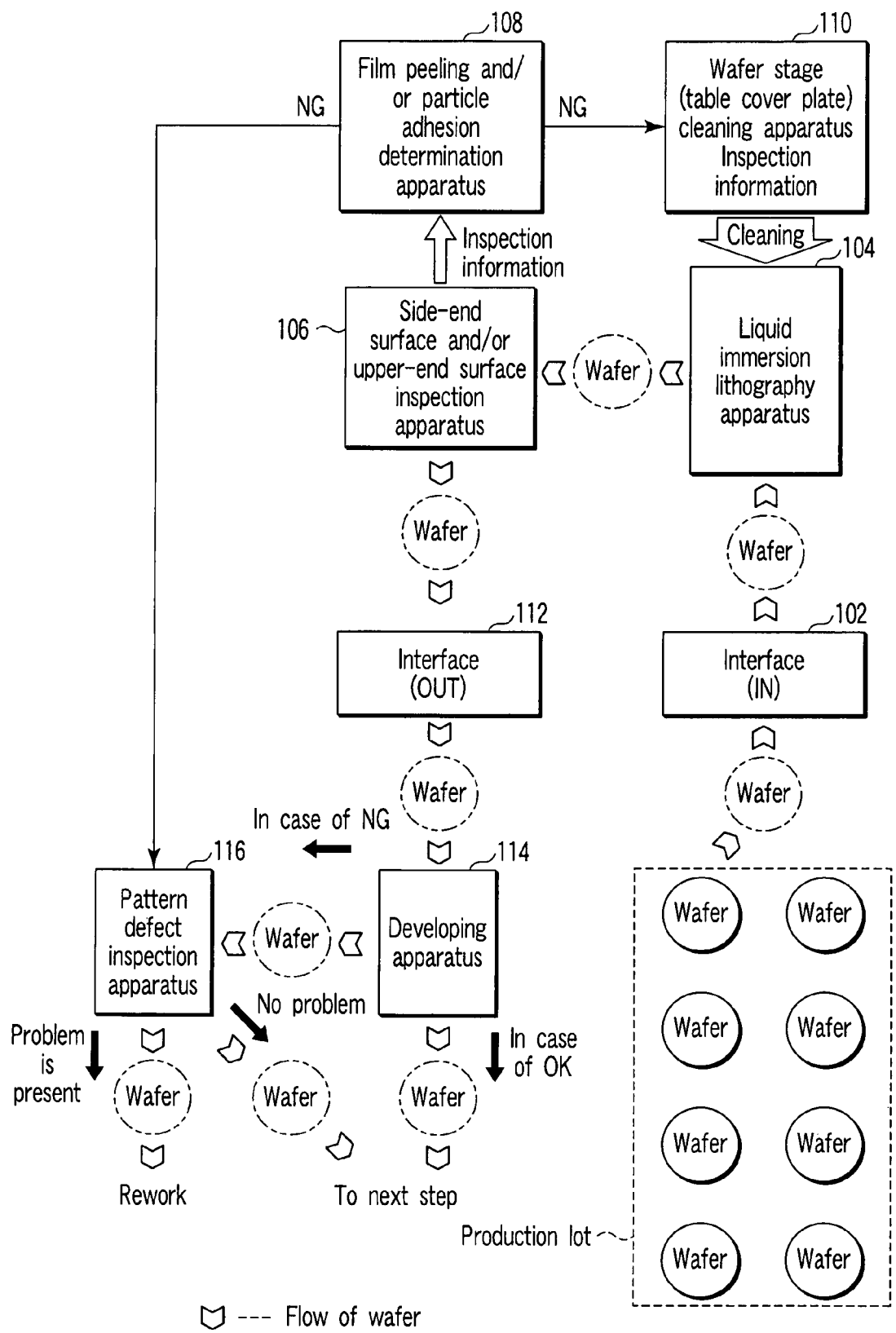
FIG. 10 is a block diagram showing an example of a liquid immersion lithography system according to a fourth embodiment of the present invention.

FIG. 10 is a block diagram showing an example of a liquid immersion lithography system according to the fourth embodiment of the present invention.

As shown in FIG. 10, a liquid immersion lithography system according to an example includes a liquid immersion lithography apparatus 104, an inspection apparatus 106, a determination apparatus 108, a cleaning apparatus 110, a developing apparatus 114, and a pattern defect inspection apparatus 116.

The liquid immersion lithography apparatus 104 performs liquid immersion lithography to a wafer, for example, a photoresist film on a wafer. As the liquid immersion lithography apparatus 104, for example, the liquid immersion lithography apparatus shown in FIG. 1 can be used.

The inspection apparatus 106 inspects at least one of a side surface of an edge of the wafer and an upper surface of the edge of the wafer. This inspection is performed by the same manner as described in the first to third embodiments.

In this example, the inspection apparatus 106 and the liquid immersion lithography apparatus 104 are independently arranged. However, the inspection apparatus 106 may be incorporated in the liquid immersion lithography apparatus 104.

Furthermore, in the example, the inspection apparatus 106 and the liquid immersion lithography apparatus 104 constitute one system (processing unit). For example, in the example, the liquid immersion lithography apparatus 104 is arranged after a load interface (IN) 102, and an unload interface (OUT) 112 is arranged after the inspection apparatus 106, so that the inspection apparatus 106 and the liquid immersion lithography apparatus 104 constitute one processing system (processing unit). This configuration has the following advantage. That is, since a wafer subjected to liquid immersion lithography can be sent to the inspection apparatus 106 without going out of the system, film peeling caused by liquid immersion lithography and particle adhesion caused by the liquid immersion lithography can be accurately detected. when the wafer subjected to the liquid immersion lithography is taken out of the system, the inspection apparatus 106 may unnecessarily detect, for example, film peeling occurring in conveyance of the wafer and particles adhering in the conveyance of the wafer. However, the inspection apparatus 106 may be removed from the liquid immersion lithography apparatus 104, and the unload interface (OUT) 112 may be arranged after the liquid immersion lithography apparatus 104. In this case, since an existing inspection apparatus, for example, an existing wafer edge face inspection apparatus, or a detection mechanism incorporated in a bevel polishing apparatus can be used, a plant investment can be advantageously suppressed. It may be appropriately selectively determined in execution whether the inspection apparatus 106 and the liquid immersion lithography apparatus 104 constitute one system (processing unit).

The determination apparatus 108 determines, on the basis of inspection information sent from the inspection apparatus 106, whether at least one of film peeling and particle adhesion has occurred on at least one of a side surface of an edge of a wafer and an upper surface of the edge of the wafer.

The cleaning apparatus 110 cleans the liquid immersion lithography apparatus 104. The cleaning apparatus 110 of the example especially cleans a table cover plate arranged on a wafer stage of the liquid immersion lithography apparatus 104. The cleaning apparatus 110 of the example performs cleaning on the basis of an instruction by an operator and cleaning on the basis of an instruction of a signal NG output from the determination apparatus 108. The signal NG is a signal representing that at least one of film peeling and particle adhesion has occurred, or a flag representing that at least one of film peeling and particle adhesion has occurred.

The developing apparatus 114 develops a photoresist film on a wafer subjected to liquid immersion lithography. When the photoresist film is developed, the photoresist film is patterned with a predetermined pattern written on a mask (reticle) in order to form desired pattern.

The pattern defect inspection apparatus 116 inspects the developed photoresist film to check whether a pattern defect has occurred thereon. The pattern defect inspection apparatus 116 performs inspection on the basis of an instruction by an operator and inspection on the basis of an instruction of the signal NG output from the determination apparatus 108.

(Basic Operation of System)

An operation of a liquid immersion lithography system according to an example will be described below along a flow of a wafer.

One wafer or a plurality of wafers in a production Lot are loaded on the liquid immersion lithography apparatus 104 through the load interface (IN) 102. The liquid immersion lithography apparatus 104 performs liquid immersion lithography of a photoresist film on the loaded wafer.

Upon completion of the liquid immersion lithography, the wafer is sent to the inspection apparatus 106. The inspection apparatus 106 inspects at least one of a side surface of an edge of the sent wafer and an upper surface of the edge of the wafer. Inspection information is sent to the determination apparatus 108.

The determination apparatus 108 determines whether at least one of film peeling and particle adhesion has occurred on at least the side surface of the edge of the wafer and the upper surface of the edge of the wafer on the basis of the inspection information. When the determination apparatus 108 determines that any one of them has occurred, the determination apparatus 108 outputs the signal NG or the flag NG. The signal NG is also sent to the cleaning apparatus 110 and the pattern defect inspection apparatus 116.

When the liquid immersion apparatus 104 receives the signal NG or the flag NG, the liquid immersion lithography apparatus 104 stops the pattern exposure and clean a table cover plate arranged on the wafer stage in the liquid immersion lithography apparatus 104 with the cleaning apparatus 110.

The wafer inspected by the inspection apparatus 106 is unloaded from the liquid immersion lithography apparatus 104 through the unload interface (OUT) 112 and sent to the developing apparatus 114. The developing apparatus 114 develops the photoresist film on the sent wafer.

Upon completion of the developing, the flow of the wafer is branched into the following two. When the signal NG is output or a flag representing NG is set, the wafer is sent to the pattern defect inspection apparatus 116. When the signal NG is not output or the flag representing NG is not set, the wafer is sent to the next process step to lithography step because OK is determined.

The wafer sent to the pattern defect inspection apparatus 116 is inspected by the pattern defect inspection apparatus 116 to check whether a pattern defect has occurred in the photoresist film.

When the inspection result has no problem, the wafer is sent to the next process step. In contrast to this, the inspection result has a problem, the wafer is sent to a rework process step (example of the rework process step will be described later).

An example of determination of the presence/absence of the problem is as follows.

For example, even though a film on a wafer is peeled or particles has adhered to the wafer, a pattern defect due to the film peeling or particle adhesion may not have occurred in a photoresist film in, for example, an effective region of the wafer. In this case, since the wafer does not require the rework process step, the wafer may be send to the next process step. The effective region of the wafer is, for example, in a central portion of the wafer and is a region which does not include a partially exposed chip or a region which is free from edge exclusion. When a shot include some chips, one partially may exposure shot include one or some fully exposed chip(s). The edge exclusion is a region (exclusive region) which is set in a region having a certain distance from an edge of the wafer, and a chip formed in a region including the edge exclusion is not used.

Even though a pattern defect occurs in a photoresist film in the effective region of the wafer, if the number of pattern defects is small, the wafer may be send to the next process step. As an extreme example, when the number of pattern defects is "one", a rework process step cannot be performed without increasing the manufacturing cost. In order to prevent this, allowable number (threshold value) is determined for the number of pattern defects or the number of chips in which pattern defects occur. When the number of pattern defects or the number of chips in which pattern defects occur are equal to or smaller than the allowable number, the wafers may be send to the next process step.

In contrast to this, when a photoresist film in an effective region of a wafer has a pattern defect, when the number of pattern defects is equal to or larger than the allowable number, or when the number of chips in which pattern defects occur is equal to or larger than the allowable number, the wafers are send to the rework process step.

(Example of Cleaning Cycle)

A cleaning cycle of the liquid immersion lithography system according to the fourth embodiment will be described below.

Figure 11:
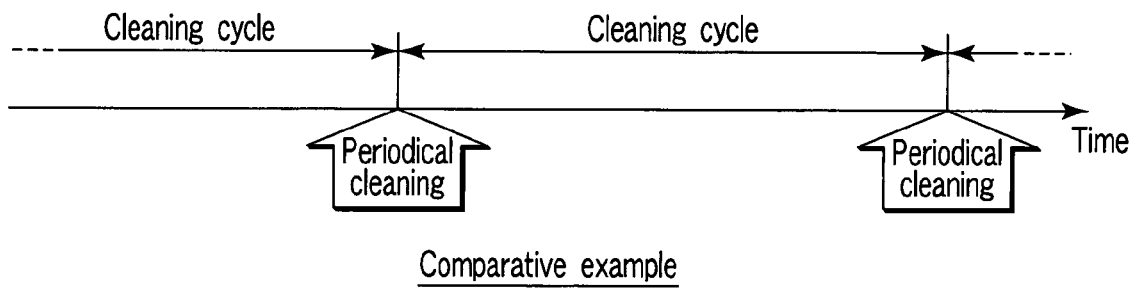
FIG. 11 is a diagram showing a cleaning cycle of a liquid immersion lithography system according to a comparative example.

FIG. 11 is a diagram showing a cleaning cycle of a liquid immersion lithography system according to a comparative example.

As shown in FIG. 11, since the liquid immersion lithography system is contaminated, the liquid immersion lithography system must be periodically cleaned. FIG. 11 shows an example in which periodical cleaning is performed at regular time intervals.

Figure 12:
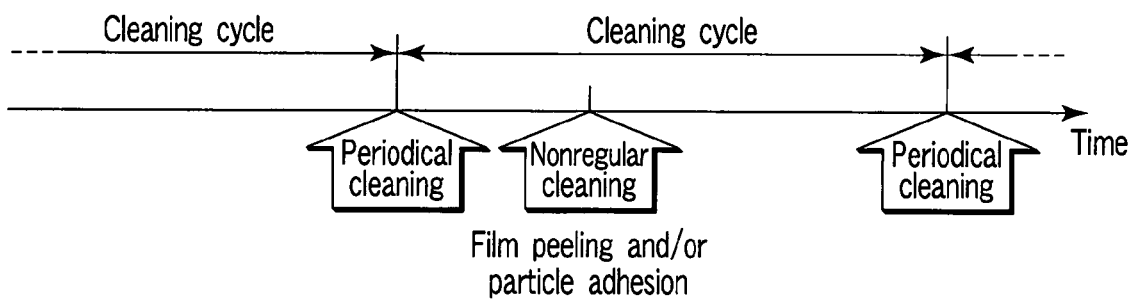
FIG. 12 is a diagram showing an example of a cleaning cycle of the liquid immersion lithography system according to the fourth embodiment.

FIG. 12 is a diagram showing an example of a cleaning cycle of the liquid immersion lithography system according to the fourth embodiment. In this example, periodical cleaning is also performed. According to the fourth embodiment, for example, in addition to periodical cleaning, nonregular cleaning is performed when at least one of film peeling and particle adhesion has occurred on at least one of a side surface of an edge of a wafer and an upper surface of the edge of the wafer.

According to the fourth embodiment, in addition to the periodical cleaning, the nonregular cleaning is performed to make it possible to recover the yield loss by at least one of the film peeling and the particle adhesion.

As in the comparative example, FIG. 12 shows an example in which periodical cleaning is performed at predetermined time intervals. However, the periodical cleaning may be changed such that the periodical cleaning is performed for every predetermined number of processed wafers.

(Example of Rework Process Step)

An example of the rework process step will be described below.

Figure 13:
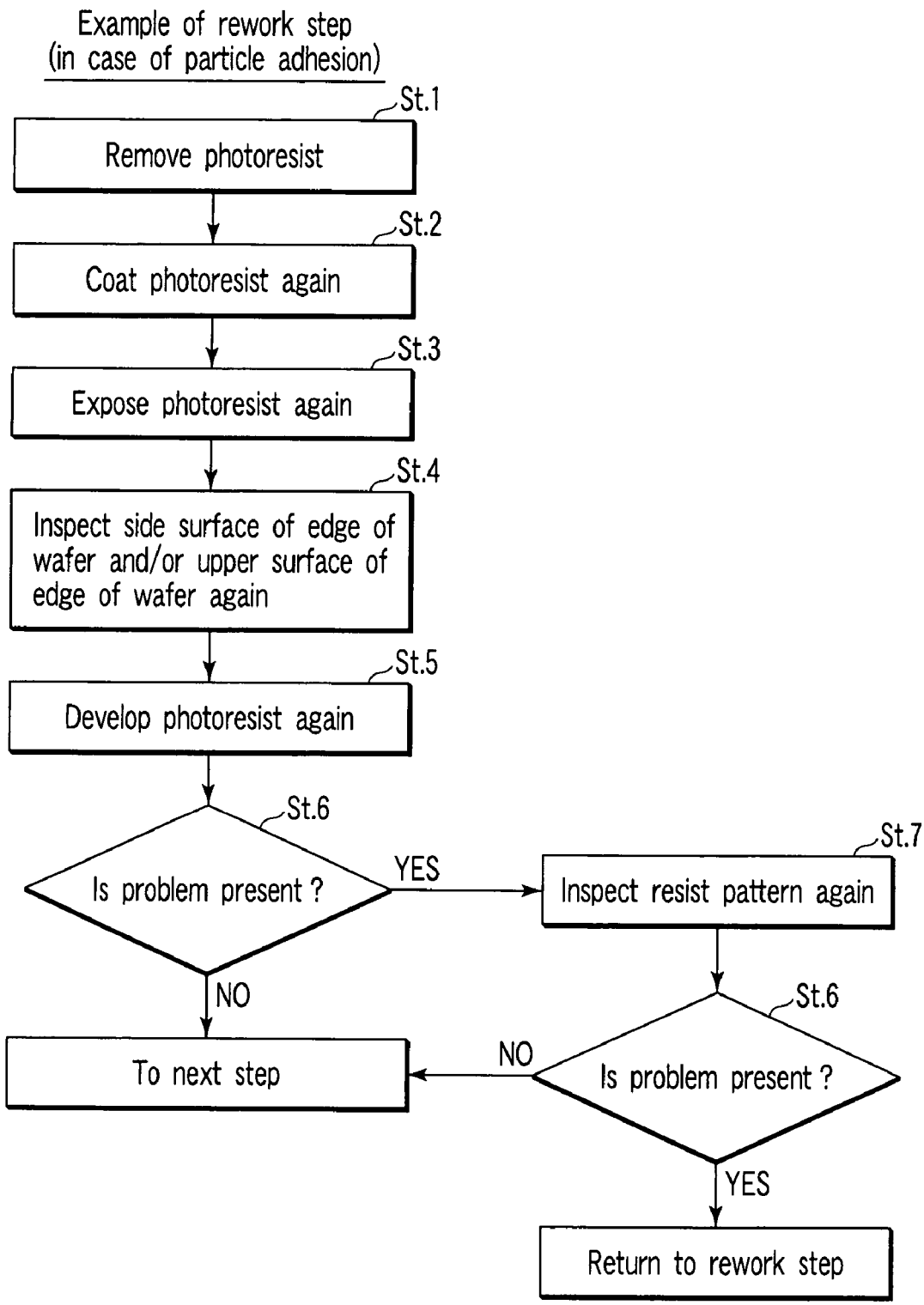
FIG. 13 is a flow chart showing a first example of a rework process step.

FIG. 13 is a flow chart showing a first example of the rework process step. The first example is an example of the rework process step performed in case of, for example, particle adhesion.

As described in St. 1, a photoresist film is removed from a wafer send to the rework process step.

As described in St. 2, a photoresist is coated on the wafer again, and a photoresist film is formed on the wafer again (St. 2).

As described in St. 3, the photoresist film is exposed again.

As described in St. 4, at least one of a side surface of an edge of the wafer and an upper surface of the edge of the wafer is inspected again to determine whether at least one of film peeling and particle adhesion has occurred on at least one of the side surface of the edge of the wafer and the upper surface of the edge of the wafer. The inspection and the determination are the same as the inspection performed by the inspection apparatus 106 and the determination performed by the determination apparatus 108, respectively.

As described in St. 5, the photoresist film is developed again.

As described in St. 6, it is determined whether the determination in the step St. 4 has a problem, i.e., at least one of film peeling and particle adhesion has occurred. When no problem (No) is determined, i.e., it is determined that neither the film peeling nor the particle adhesion has occurred, the wafer subjected to the rework process is send to the next process step.

In contrast to this, when the presence of a problem (Yes) is determined, i.e., it is determined that at least one of the film peeling and the particle adhesion has occurred, the photoresist pattern is inspected again (St. 7). This is the same as the inspection performed by the pattern defect inspection apparatus 116.

As described in St. 8, when no problem (No) is determined as a result of the re-inspection described in St. 7, the wafer subjected to the rework process is send to the next process step.

In contrast to this, when the presence of a problem (Yes) is determined, the wafer subjected to the rework process is returned to the rework process step again.

The example of the flow shown in FIG. 13 indicates a basic flow. For this reason, depending on cases, a flow which endlessly repeats the rework process step is used. This circumstance can be canceled as follows. That is, a limited number of times is determined for the number of times of the rework process performed to a wafer, and the rework process for the wafer is not performed when the number of times of the rework process reaches the limited number of times. Alternatively, once the rework process is performed, the rework process may not be performed again.

When the rework process is repeated, a physical and/or chemical history on a wafer, for example, a thermal history is greater than that of a wafer to which the rework process is not performed. Therefore, depending on cases, device characteristics may be deteriorated. Alternatively, the optical or chemical property of a film near the wafer surface changes to change a resist pattern shape. As a result, desired device characteristics may not be obtained. In order to solve this problem, as described above, the number of times of the rework process is limited, or once the rework process is performed, the rework process is not performed again to make it possible to solve the problem.

Figure 14:
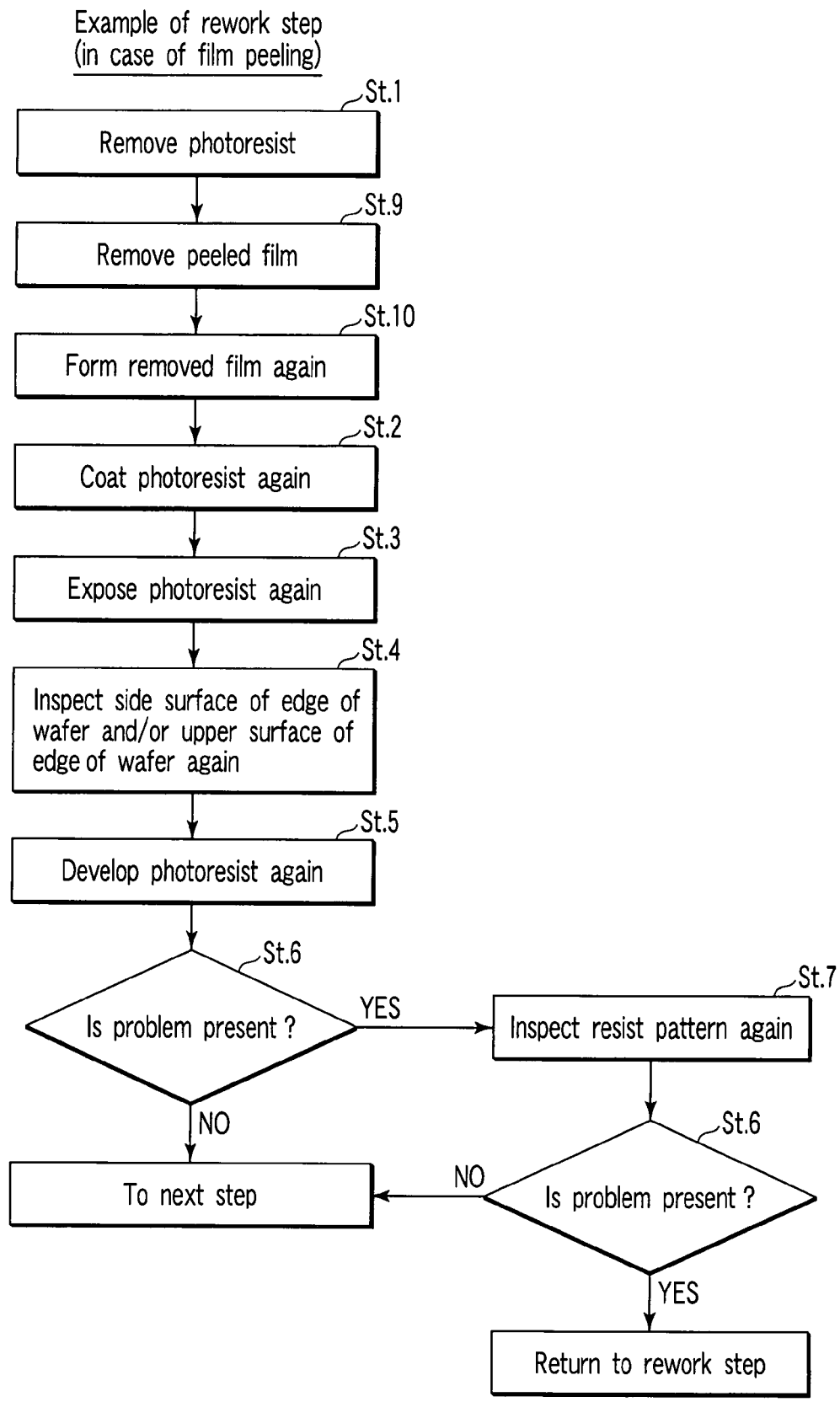
FIG. 14 is a flow chart showing a second example of a rework process step.

FIG. 14 is a flow chart showing a second example of the rework process step. The second example is an example of the rework process step performed in case of, for example, film peeling.

As shown in FIG. 14, the flow of the second example is different from the flow of the first example in that after the photoresist film described in St. 1 is removed, the peeled film is removed (St. 9), and the removed film is formed again (St. 10). After the removed film is formed again, as described in St. 2, a photoresist is coated again. The subsequent steps are the same as the steps in the first example shown in FIG. 8. An explanation of the steps subsequent to St. 2 in the second example is omitted by quoting the explanation of the first example.

(Example of Wafer Send to Pattern Defect Inspection or Rework Process)

FIG. 15 is a diagram showing a first example of a wafer send to pattern defect inspection or a rework process.

As shown in FIG. 15, a production Lot includes a plurality of wafers. Numbers written in the wafers denote processing turns of processing, respectively. Wafer 1 to wafer 3 are subjected to liquid immersion lithography. It is assumed that it is determined that at least one of film peeling and particle adhesion has occurred on at least one of a side surface of an edge of the wafer 3 and an upper surface of the edge of the wafer 3.

The first example shows a basic example. In the first example, additional inspection, for example, inspection including pattern defect inspection is performed to the wafer 3 in which at least one of the film peeling and the particle adhesion has occurred. Furthermore, the rework process is performed to the wafer 3.

In this manner, the additional inspection, for example, the inspection including the pattern defect inspection, and the rework process may be performed to the wafer 3 in which at least one of the film peeling and the particle adhesion has occurred.

FIG. 16 is a diagram showing a second example of a wafer send to pattern defect inspection or a rework process.

Some liquid immersion lithography systems perform immersion pattern exposure to a subsequent wafer while inspecting at least one of a side surface of an edge of an exposed wafer and an upper surface of the edge of the exposed wafer. The second example is an example which can be applied to the above example.

In the second embodiment, among wafers included in a production lot to which the wafer 3 in which at least one of the film peeling and the particle adhesion has occurred belongs, the wafer 3 and subsequent wafer 4 to wafer 6 which are processed by the liquid immersion lithography apparatus which has performed immersion pattern exposure to the wafer 3 are subjected to additional inspection, for example, inspection including pattern defect inspection. Furthermore, the rework process is performed to the wafer 3 to wafer 6.

In this manner, the additional inspection, for example, inspection including pattern defect inspection, and the rework process can also be performed to the wafer 3 in which at least one of the film peeling and the particle adhesion has occurred and the subsequent wafers 4 to 6 processed by the liquid immersion lithography apparatus which has performed immersion pattern exposure to the wafer 3.

Furthermore, in the second example, for example, for the wafers 4 to 6, inspection by using the inspection apparatus 106 is omitted, and the wafers 4 to 6 can be send to the additional inspection, for example, the inspection including the pattern defect inspection, and the rework process. For the wafers 4 to 6, for example, the inspection using the inspection apparatus 106 is omitted, so that a throughput can be increased.

FIG. 17 is a diagram showing a third example of a wafer send to the pattern defect inspection or the rework process.

In the third example, as in the second example, while at least one of a side surface of an edge of an exposed wafer and an upper surface of the edge of the exposed wafer is inspected, liquid immersion lithography is performed to the subsequent wafer. The third example is different from the second example in that, when it is determined that at least one of the film peeling and the particle adhesion has occurred, immersion pattern exposure to wafer 7 with liquid immersion lithography is stopped halfway. Except for this, the third example is the same as the second example.

Since the wafer 7 the immersion pattern exposure to which is stopped halfway is incompletely exposed, the inspection using the inspection apparatus 106 and the inspection using the pattern defect inspection apparatus 116 are omitted for the wafer 7, and the wafer 7 is directly send to the rework process.

Also in the third example, as in the second example, a throughput can be increased.

Furthermore, according to the third example, when it is determined that at least one of the film peeling and the particle adhesion has occurred, the immersion pattern exposure to the wafer 7 is stopped halfway. For this reason, the apparatus need not wait for the edge of the immersion pattern exposure. Therefore, the throughput can be further improved in comparison with, for example, the second embodiment.

According to the first to fourth embodiments, a method of manufacturing a semiconductor device by using a liquid immersion lithography apparatus in a lithography step and a liquid immersion lithography system can be provided to recover the yield loss.

Further, the above embodiments include the following aspects.

(1) A method of manufacturing a semiconductor device using a liquid immersion lithography apparatus in a lithography step in an element manufacturing step, comprising:

in a period from the liquid immersion lithography step performed by the liquid immersion lithography apparatus to a step in which a film structure of an edge of at least a wafer changes from a timing of the liquid immersion lithography step, a step of inspecting at least one of a side surface of an edge of the wafer and an upper surface of the edge of the wafer;

a step of determining, on the basis of an inspection result obtained in the inspection step, at least one of the presence/absence of film peeling and the presence/absence of particle adhesion on at least one of the side surface of the edge of the wafer and the upper surface of the edge of the wafer; and a step of performing a predetermined coping process when it is determined in the determination step that at least one of the film peeling and the particle adhesion has occurred.

(2) The method of manufacturing a semiconductor device according to (1), wherein the inspection step includes inspecting whether at least one of the film peeling and the particle adhesion has occurred on at least one of the side surface of the edge of the wafer and the upper surface of the edge of the wafer and outputting a detection signal when at least one of the film peeling and the particle adhesion has occurred, and the determination step includes determining at least one of the presence/absence of film peeling and the presence/absence of particle adhesion by using the detection signal.

(3) The method of manufacturing a semiconductor device according to (1), further comprising:

in a period from a step in which the same film structure as in the pattern exposure step is formed at least at an edge of a wafer to the pattern exposure step, a step of inspecting at least one of the side surface of the edge of the wafer and the upper surface of the edge of the wafer; and a step of determining at least one of the presence/absence of film peeling and the presence/absence of particle adhesion on at least one of the side surface of the edge of the wafer and the upper surface of the edge of the wafer on the basis of an inspection result obtained in the inspection step.

(4) The method of manufacturing a semiconductor device according to (1), wherein the predetermined coping process includes a cleaning step of cleaning a surface of an table cover plate arranged on a wafer stage of the liquid immersion lithography apparatus.

(5) The method of manufacturing a semiconductor device according to (1), wherein the predetermined coping process includes an additional inspection step of performing additional inspection to at least one corresponding wafer of (a) a wafer in which at least one of the film peeling and the particle adhesion has occurred, and (b) a wafer corresponding to the wafer in the (a), and among wafers included in a production lot to which the wafer corresponding to the wafer in the (a) belongs, a wafer which is processed by using the liquid immersion lithography apparatus after the wafer corresponding to the wafer in the (a).

(6) The method of manufacturing a semiconductor device according to (5), wherein the additional inspection includes pattern defect inspection for inspecting a defect of a resist pattern formed on the wafer.

(7) The method of manufacturing a semiconductor device according to (6), wherein the pattern defect inspection includes:

a step of acquiring an image of a surface of the resist pattern formed on the wafer;

a step of processing the acquired image; and a step of detecting a pattern defect occurring in the resist pattern on the basis of a result of the image processing.

(8) The method of manufacturing a semiconductor device according to (1), wherein the predetermined coping process includes a rework process for reworking a wafer corresponding to at least one of the following (a) to (c):

(a) a wafer in which at least one of the film peeling and the particle adhesion has occurred;

(b) a wafer corresponding to the wafer in the (a), and among wafers included in a production lot to which the wafer corresponding to the wafer in the (a) belongs, a wafer which is processed by using the liquid immersion lithography apparatus after the wafer corresponding to the wafer in the (a); and (c) a wafer corresponding to the wafer in the (a), and among wafers included in a production lot to which the wafer corresponding to the wafer in the (a) belongs, a wafer which is being processed by using the liquid immersion lithography apparatus after the wafer corresponding to the wafer in the (a).

(9) The method of manufacturing a semiconductor device according to (8), wherein the rework process includes reexecution of the immersion pattern exposure step using the liquid immersion lithography apparatus.

(10) A liquid immersion lithography system comprising:

a liquid immersion lithography apparatus which performs immersion pattern exposure to a wafer;

an inspection mechanism which inspects at least one of a side surface of an edge of the wafer and an upper surface of the edge of the wafer;

a determination mechanism which determines, on the basis of an inspection result obtained from the inspection mechanism, at least one of the presence/absence of film peeling and the presence/absence of particle adhesion on at least one of the side surface of the edge of the wafer and the upper surface of the edge of the wafer; and a coping process mechanism which performs a predetermined coping process when it is determined by the determination mechanism that at least one of the film peeling and the particle adhesion has occurred.

(11) The liquid immersion lithography system according to (10), wherein the predetermined coping process mechanism includes a cleaning mechanism which cleans a surface of a table cover plate arranged on a wafer stage of the liquid immersion lithography apparatus.

(12) The liquid immersion lithography system according to (10), wherein the coping process mechanism includes an additional inspection mechanism which performs additional inspection to at least one corresponding wafer of (a) a wafer in which at least one of the film peeling and the particle adhesion has occurred, and (b) a wafer corresponding to the wafer in the (a), and among wafers included in a production lot to which the wafer corresponding to the wafer in the (a) belongs, a wafer which is processed by using the liquid immersion lithography apparatus after the wafer corresponding to the wafer in the (a).

(13) The liquid immersion lithography system according to (12), wherein the additional inspection includes pattern defect inspection for inspecting a defect of a resist pattern formed on the wafer.

(14) The liquid immersion lithography system according to (13), wherein the pattern defect inspection includes:

a step of acquiring an image of a surface of the resist pattern formed on the wafer;

a step of processing the acquired image; and a step of detecting a pattern defect occurring in the resist pattern on the basis of a result of the image processing.

(15) The liquid immersion lithography system according to (10), wherein the coping process mechanism includes a rework process for reworking a wafer corresponding to at least one of the following (a) to (c):

(a) a wafer in which at least one of the film peeling and the particle adhesion has occurred;

(b) a wafer corresponding to the wafer in the (a), and among wafers included in a production lot to which the wafer corresponding to the wafer in the (a) belongs, a wafer which is processed by using the liquid immersion lithography apparatus after the wafer corresponding to the wafer in the (a); and (c) a wafer corresponding to the wafer in the (a), and among wafers included in a production lot to which the wafer corresponding to the wafer in the (a) belongs, a wafer which is being processed by using the liquid immersion lithography apparatus after the wafer corresponding to the wafer in the (a).

(16) The liquid immersion lithography system according to (15), wherein the rework process includes reexecution of the immersion pattern exposure step using the liquid immersion lithography apparatus.

Although the invention has been described with reference to the several embodiments, the invention is not limited to the embodiments. In implementation of the invention, the invention can be variably changed without departing from the spirit and scope of the invention.

The embodiments can be singularly carried out, and appropriate combinations of the embodiments can also be carried out.

Each of the embodiments includes inventions of various stages, and the inventions of the various stages can be extracted by an appropriate combination of a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device using a liquid immersion lithography apparatus in a lithography step in an element manufacturing step, comprising:

in a period from the liquid immersion lithography step performed by the liquid immersion lithography apparatus to a step in which a film structure of an edge of at least a wafer changes from a timing of the liquid immersion lithography step, (A) inspecting at least one of a side surface of an edge of the wafer and an upper surface of the edge of the wafer, using an inspection mechanism;

(B) determining, on the basis of an inspection result obtained in the (A), at least one of the presence/absence of film peeling and the presence/absence of particle adhesion on at least one of the side surface of the edge of the wafer and the upper surface of the edge of the wafer, using a determination mechanism; and (C) performing a predetermined coping process, using a coping process mechanism, when it is determined in the (B) that at least one of the film peeling and the particle adhesion has occurred, wherein the predetermined coping process includes a cleaning process in which a surface of a table cover plate used to hold the wafer and arranged on a wafer stage of the liquid immersion lithography apparatus is cleaned.

2. The method according to claim 1, wherein the (A) includes inspecting whether at least one of the film peeling and the particle adhesion has occurred on at least one of the side surface of the edge of the wafer and the upper surface of the edge of the wafer and outputting a detection signal when at least one of the film peeling and the particle adhesion has occurred, and the (B) includes determining at least one of the presence/absence of film peeling and the presence/absence of particle adhesion by using the detection signal.

3. The method according to claim 1, further comprising:

in a period from a step in which the same film structure as in the pattern exposure step is formed at least at an edge of a wafer to the pattern exposure step, (D) inspecting at least one of the side surface of the edge of the wafer and the upper surface of the edge of the wafer; and (E) determining at least one of the presence/absence of film peeling and the presence/absence of particle adhesion on at least one of the side surface of the edge of the wafer and the upper surface of the edge of the wafer on the basis of an inspection result obtained in the (D).

4. The method according to claim 1, wherein the predetermined coping process includes an additional inspection process which performing additional inspection to at least one corresponding wafer of (1) a wafer in which at least one of the film peeling and the particle adhesion has occurred, and (2) a wafer corresponding to the wafer in the (1), and among wafers included in a production lot to which the wafer corresponding to the wafer in the (1) belongs, a wafer which is processed by using the liquid immersion lithography apparatus after the wafer corresponding to the wafer in the (1).

5. The method according to claim 4, wherein the additional inspection includes pattern defect inspection which inspecting a defect of a resist pattern formed on the wafer.

6. The method according to claim 5, wherein the pattern defect inspection includes:

acquiring an image of a surface of the resist pattern formed on the wafer; processing the acquired image; and detecting a pattern defect occurring in the resist pattern on the basis of a result of the image processing.

7. The method according to claim 1, wherein the predetermined coping process includes a rework process which reworking a wafer corresponding to at least one of the following (1) to (3):

(1) a wafer in which at least one of the film peeling and the particle adhesion has occurred;

(2) a wafer corresponding to the wafer in the (1), and among wafers included in a production lot to which the wafer corresponding to the wafer in the (1) belongs, a wafer which is processed by using the liquid immersion lithography apparatus after the wafer corresponding to the wafer in the (1); and (3) a wafer corresponding to the wafer in the (1), and among wafers included in a production lot to which the wafer corresponding to the wafer in the (1) belongs, a wafer which is being processed by using the liquid immersion lithography apparatus after the wafer corresponding to the wafer in the (1).

8. The method according to claim 7, wherein the rework process includes reexecution of the liquid immersion lithography step using the liquid immersion lithography apparatus.

9. A liquid immersion lithography system comprising:

a liquid immersion lithography apparatus which performs liquid immersion lithography to a wafer;

an inspection mechanism which inspects at least one of a side surface of an edge of the wafer and an upper surface of the edge of the wafer;

a determination mechanism which determines, on the basis of an inspection result obtained from the inspection mechanism, at least one of the presence/absence of film peeling and the presence/absence of particle adhesion on at least one of the side surface of the edge of the wafer and the upper surface of the edge of the wafer; and a coping process mechanism which performs a predetermined coping process when it is determined by the determination mechanism that at least one of the film peeling and the particle adhesion has occurred, wherein the coping process mechanism includes a cleaning mechanism which cleans a surface of a table cover plate used to hold the wafer and arranged on a wafer stage of the liquid immersion lithography apparatus.

10. The system according to claim 9, wherein the coping process mechanism includes an additional inspection mechanism which performs additional inspection to at least one corresponding wafer of (1) a wafer in which at least one of the film peeling and the particle adhesion has occurred, and (2) a wafer corresponding to the wafer in the (1), and among wafers included in a production lot to which the wafer corresponding to the wafer in the (1) belongs, a wafer which is processed by using the liquid immersion lithography apparatus after the wafer corresponding to the wafer in the (1).

11. The system according to claim 10, wherein the additional inspection includes pattern defect inspection which inspecting a defect of a resist pattern formed on the wafer.

12. The system according to claim 11, wherein the pattern defect inspection includes:

acquiring an image of a surface of the resist pattern formed on the wafer;

processing the acquired image; and detecting a pattern defect occurring in the resist pattern on the basis of a result of the image processing.

13. The system according to claim 9, wherein the coping process mechanism includes a rework process which reworking a wafer corresponding to at least one of the following (1) to (3):

(1) a wafer in which at least one of the film peeling and the particle adhesion has occurred;

(2) a wafer corresponding to the wafer in the (1), and among wafers included in a production lot to which the wafer corresponding to the wafer in the (1) belongs, a wafer which is processed by using the liquid immersion lithography apparatus after the wafer corresponding to the wafer in the (1); and (3) a wafer corresponding to the wafer in the (1), and among wafers included in a production lot to which the wafer corresponding to the wafer in the (1) belongs, a wafer which is being processed by using the liquid immersion lithography apparatus after the wafer corresponding to the wafer in the (1).

14. The system according to claim 13, wherein the rework process includes reexecution of the liquid immersion lithography step using the liquid immersion lithography apparatus.

* * * * *